United States Patent [19]
Goetting et al.

[11] Patent Number: 5,399,924
[45] Date of Patent: Mar. 21, 1995

[54] LOW CURRENT OPTIONAL INVERTER

[75] Inventors: F. Erich Goetting, Cupertino; David P. Schultz, San Jose, both of Calif.

[73] Assignee: Xilinx, Inc., San Jose, Calif.

[21] Appl. No.: 204,939

[22] Filed: Mar. 1, 1994

[51] Int. Cl.⁶ .......................................... H03R 19/094
[52] U.S. Cl. ...................................... 326/45; 326/121
[58] Field of Search ............... 307/443, 451, 465, 469, 307/585, 272.2

[56] References Cited
U.S. PATENT DOCUMENTS

| | | |
|---|---|---|
| 4,567,385 | 1/1986 | Falater et al. ............... 307/469 X |
| 5,331,226 | 7/1994 | Goetting .............................. 307/465 |

*Primary Examiner*—David R. Hudspeth
*Attorney, Agent, or Firm*—Edel M. Young

[57] ABSTRACT

A low power optional inverter uses P-channel and N-channel transistors in series as in a conventional CMOS inverter, but in one embodiment connects complementary signals to the sources of the P-channel and N-channel transistors such that when the complementary signals are switched the circuit switches between an inverting and a non-inverting buffer. In some embodiments P-channel and/or N-channel pass transistors are used in the non-inverting mode to avoid the threshold voltage drop associated with a CMOS non-inverting buffer. In another embodiment, in the noninverting mode, at least one bypass transistor is turned on and power is not supplied to the inverter. In yet another embodiment, in the inverting mode a CMOS inverter is powered with conventional voltages and in the noninverting mode the CMOS inverter is disabled and a bypass transistor connects input to output.

10 Claims, 5 Drawing Sheets

LOW CURRENT OPTIONAL INVERTER

RELATED APPLICATION INFORMATION

This application relates to commonly owned copending U.S. Patent applications which are incorporated herein by reference:

1. Ser. No. 07/919,352 entitled "COMPACT LOGIC CELL FOR FIELD PROGRAMMABLE GATE ARRAY CHIP" filed Jul. 23, 1992 by F. Erich Goetting, David B. Parlour, and Stephen M. Trimberger [docket no. M-1743-0],
2. Ser. No. 07/919,658, entitled "LOGIC CELL FOR FIELD PROGRAMMABLE GATE ARRAY HAVING OPTIONAL INTERNAL FEEDBACK AND OPTIONAL CASCADE" filed Jul. 23, 1992 by F. Erich Goetting and Stephen M. Trimberger [docket number M-1743-1],
3. Ser. No. 07/919,812, entitled "LOGIC CELL FOR FIELD PROGRAMMABLE GATE ARRAY HAVING OPTIONAL INPUT INVERTERS", filed Jul. 23, 1992 by F. Erich Goetting [docket no. M-1743-2], now U.S. Pat. No. 5,331,226.
4. Ser. No. 07/919,407, entitled "CONTROL UNIT FOR PROGRAMMING A FIELD PROGRAMMABLE GATE ARRAY AND READING ARRAY STATUS", filed Jul. 23, 1992 by F. Erich Goetting, now U.S. Pat. No. 5,291,079 [docket no. M-1743-3], and
5. Ser. No. 07/919,491FIELD, entitled "LOGIC CELL WHICH CAN BE CONFIGURED AS A LATCH WITHOUT STATIC ONE'S PROBLEM, filed Jul. 23, 1992 by F. Erich Goetting, now U.S. Pat. No. 5,319,254 [docket no. M-1743-4],

FIELD OF THE INVENTION

This invention relates to integrated circuit devices, more particularly to programmable inverters for programmable logic devices.

BACKGROUND OF THE INVENTION

In a programmable logic device there is need for an optional inverter, that is, a circuit which can either pass a signal in its non-inverted form or can invert the signal, as selected by a user. FIG. 1 shows such a circuit. P-channel transistor T1 and N-channel transistor T2 form a standard CMOS inverter. Memory cell M1 provides complementary signals which control pass-gate transistors T3 and T4 such that circuit 101 provides either the non-inverted input signal through transistor T3 or the inverted input signal through transistor T4. In a 5-volt system, when input line IN carries about 5 volts, transistor T2 is on and transistor T1 is off. Thus the inverted output line INV is connected to ground or 0 volts. When input line IN carries about 0 volts, transistor T1 is on and T2 is off, so that line INV is connected to VCC or 5 volts. In either case there is no path from VCC to ground through transistors T1 and T2 because one of them is off. However, transistor characteristics are usually chosen so that when the input signal on line IN is switching through the range of 2 to 3 volts, both transistors T1 and T2 are partly on and there is a current path from power to ground. Even when the non-inverted path through transistor T3 has been chosen, the CMOS inverter formed by transistors T1 and T2 causes a current drain when the input signal is switching.

Other optional inverters are known. FIG. 2 shows another prior art optional inverter in which transistors T1 and T2 of a standard CMOS inverter generate the complement of the input signal on line IN. When the signal on line IN is about 5 volts, transistor T7 is on and the inverted signal from memory cell M1 is provided as the output signal on line OUT. When the signal on line IN is about 0 volts, transistor T8 is on, and provides the non-inverted signal from memory cell M1 to line OUT. If memory cell M1 carries a logical 0 value, the circuit of FIG. 2 is a non-inverting buffer, while if memory cell M1 carries a logical 1 value (5 volts), the circuit is an inverter. In both embodiments (FIGS. 1 and 2), the CMOS inverter comprising transistors T1 and T2 drains power when the signal on line IN switches through the range of 2 to 3 volts, regardless of whether the output is to be inverted from the input signal. In integrated circuit devices it is desirable to decrease power use where possible.

SUMMARY OF THE INVENTION

According to the present invention, a low power optional inverter is provided using CMOS technology, which in its non-inverting mode, does not drain power upon switching of the input signal. The optional inverter also does not drain power when an input is floating. Eliminating power drain for an inverter can save considerable power for the entire chip when many thousand such inverters are included in the chip. Such a low power optional inverter is particularly useful when a circuit is being powered up or when inputs to optional inverters have not yet been connected, because in these conditions the inverter input can assume an intermediate voltage and thus cause power drain.

The inverter of the present invention comprises a CMOS inverter-like structure having P-channel and N-channel transistors connected in series and in which positive and negative voltage supplies are driven from opposite polarities of a selection signal. In its inverting mode, the optional inverter receives a positive supply voltage at the source of its P-channel transistor and a negative supply voltage at the source of its N-channel transistor. In the non-inverting state, power of opposite polarity is applied to the sources of the two transistors. In some embodiments, in the non-inverting state, one or two bypass transistors are turned on so that input and output of the CMOS inverter-like structure are connected together, thus avoiding any voltage drop between input and output.

In one embodiment, the low current optional inverter may be combined advantageously with a subsequent logic gate using P-channel transistors which have a relatively high threshold voltage. Thus if the optional inverter generates a logic 1 voltage of only 3.5 to 4 volts in a 5-volt system, the P-channel transistors controlled by the optional inverter output signal will be fully off, and the subsequent logic gate will not draw high current in such a state. Also, if the optional inverter itself is to receive its input from a source which uses about 3.5 to 4 volts to represent logic 1, the P-channel transistor in the optional inverter is preferably high threshold and will be off when the input voltage is above about 3.4 volts.

DETAIL DESCRIPTION OF THE INVENTION

Figure 1:
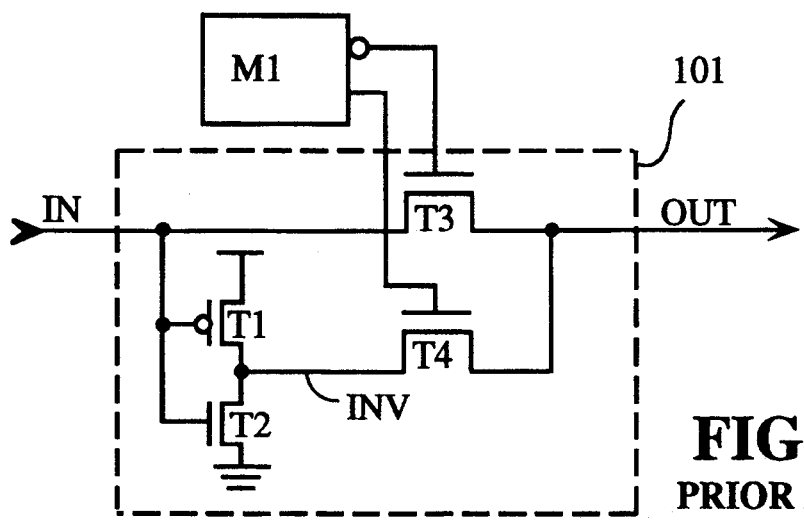
FIGS. 1 and 2 show prior art optional inverters.
Figure 2:
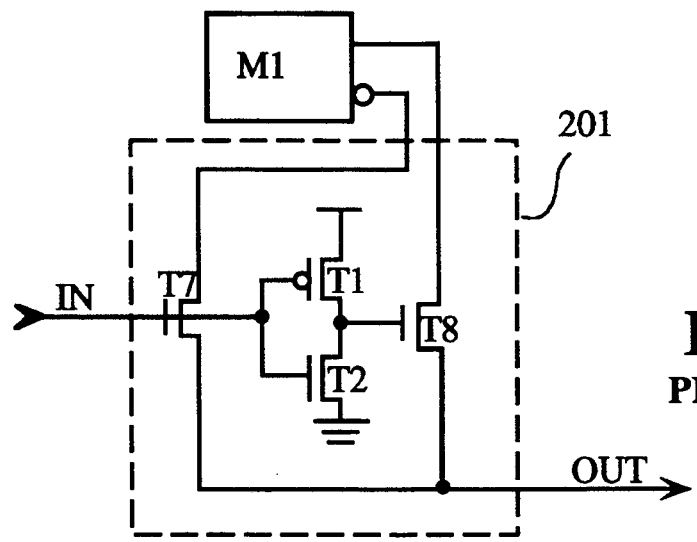
Figure 3:
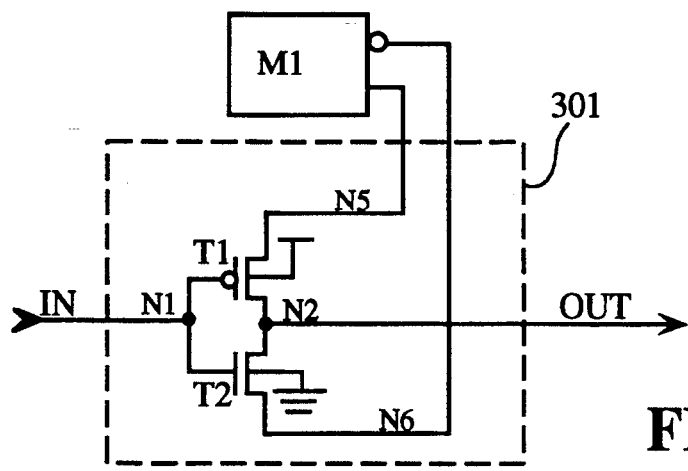
FIGS. 3, 4, 5, and 6 shows optional inverters of the present invention.

As shown in FIG. 3, the invention includes an inverter-like circuit comprising P-channel transistor T1 and N-channel transistor T2. Gates of transistors T1 and T2 are commonly connected to an input signal line IN at node N1. Drains of transistors T1 and T2 are commonly connected at node N2 to an output signal line OUT. However, as a novel feature of the invention, complementary signals on nodes N5 and N6 drive sources of transistors T1 and T2, respectively. The embodiment of FIG. 3 shows complementary signals provided by memory cell M1. In such an embodiment, the outputs of memory cell M1 must be designed such that transients created when the output signal on line OUT is switching from one rail to another do not disturb the state of memory cell M1. In another embodiment, complementary signals may be taken from input and output terminals of an inverter which is driven by a control signal or a memory cell. In other embodiments, these complementary signals can be generated from other sources within the integrated circuit device.

As shown in FIG. 3, when memory cell M1 holds a logical 1 (the inverting mode), a positive voltage, typically 5 volts, is applied at node N5 to the source of transistor T1, and a ground signal, typically 0 volts, is applied at node N6 to the source of transistor T2. Thus the circuit functions as a standard CMOS inverter.

However, when memory cell M1 holds a logical 0 (non-inverting mode), a 0 volt signal appears at node N5 and a 5 volt signal at node N6. In this mode, transistors T1 and T2 do not form a CMOS inverter but instead form a weak non-inverting buffer. In this non-inverting mode, a logical 1 input signal IN on node N1 is applied to transistor T2, which turns on transistor T2. Thus the 5-volt level on node N6 is transmitted through transistor T2 with one threshold voltage drop to node N2. Likewise, when the input signal on node N1 is a logical 0, transistor T1 is turned on and transistor T2 is turned off so that node N2 is pulled one threshold voltage above ground by transistor T1. Thus when memory cell M1 holds a logical 0, transistors T1 and T2 form a non-inverting buffer. In the non-inverting mode, as the input signal IN swings through the voltage range of two volts between one rail and the other, transistors T2 and T1 will never be turned on simultaneously. (In order for P-channel transistor T1 to turn on, the drain must be one threshold voltage above the gate. For example, consider the case in which the input signal on line IN is 2 volts. For P-channel transistor T1 to turn on, the drain must be close to 3 volts. But if the drain of T1 is at about 3 volts, N-channel transistor T2 will not turn on because its gate at 2 volts is at a lower voltage than its drain.) Thus when the circuit of FIG. 3 is in its non-inverting mode there is no current loss upon switching of the input signal on line IN. Therefore current loss through this optional inverter is less than that of the prior art optional CMOS inverters.

In the embodiment of FIG. 3, the signal on node N2 does not follow the input voltage from rail to rail because of the threshold voltage drops at transistors T1 and T2. Also if the signal on line IN were to remain in the 2–3 volt range for a period of time, the output signal on line OUT would float to an unknown level because both of transistors T1 and T2 would be off.

Figure 4:
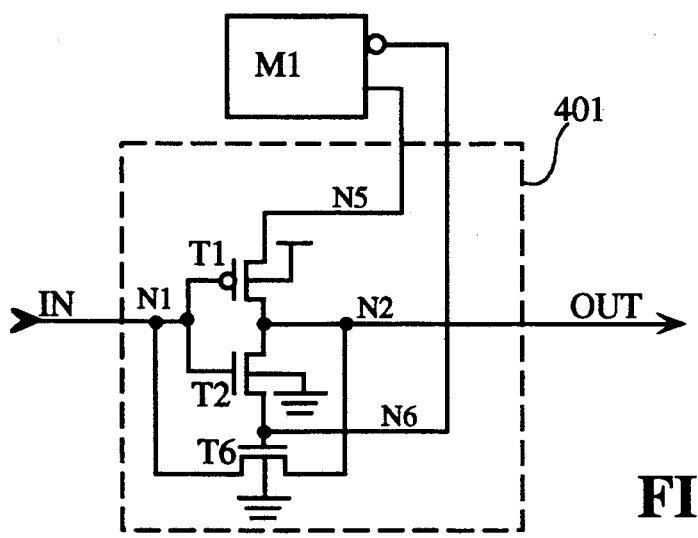

FIG. 4 shows another embodiment in which transistor T6 is added. For the non-inverting mode, transistor T6 is turned on by the 5 volt signal at node N6 and provides a path between input line IN and output line OUT. In the non-inverting mode, an intermediate signal on line IN does not produce a floating output signal on line OUT because the signal on line OUT follows the signal on line IN. A logical 0 input signal on line IN passed by transistor T6 pulls the output signal OUT on node N2 directly to the ground rail so the low input signal does not suffer a threshold voltage drop. However, in the embodiment of FIG. 4, when the input signal on line IN is a logical 1, the logical 1 output signal OUT is still one threshold voltage drop (typically 0.8 volts to 1.0 below the positive voltage supply because of the threshold voltage drop of the signal across transistor T2. The embodiment of FIG. 4 is nevertheless acceptable when the device being driver by line OUT is a CMOS inverter having a P-channel transistor with a high threshold voltage (1.6 volts) because a 4-volt signal is still high enough that this P-channel transistor will be off. And since transistor T6 pulls the output signal to 0 in response to a 0 volt input signal, it is not necessary that the N-channel transistor of the CMOS inverter have a high threshold voltage.

Figure 5:
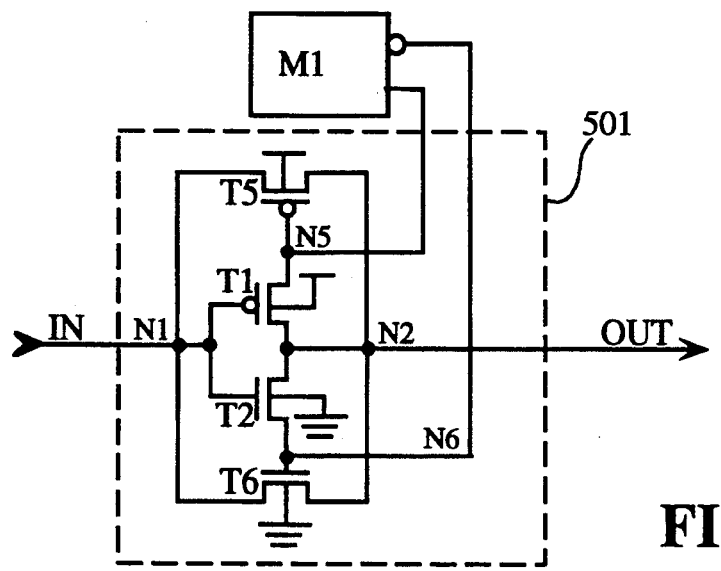

FIG. 5 shows a further embodiment in which transistors T5 and T6 combine to provide the input signal on line IN to output line OUT without any threshold voltage drop in the non-inverting mode for both logical 0 and logical 1 input signals on line IN.

Figure 6:
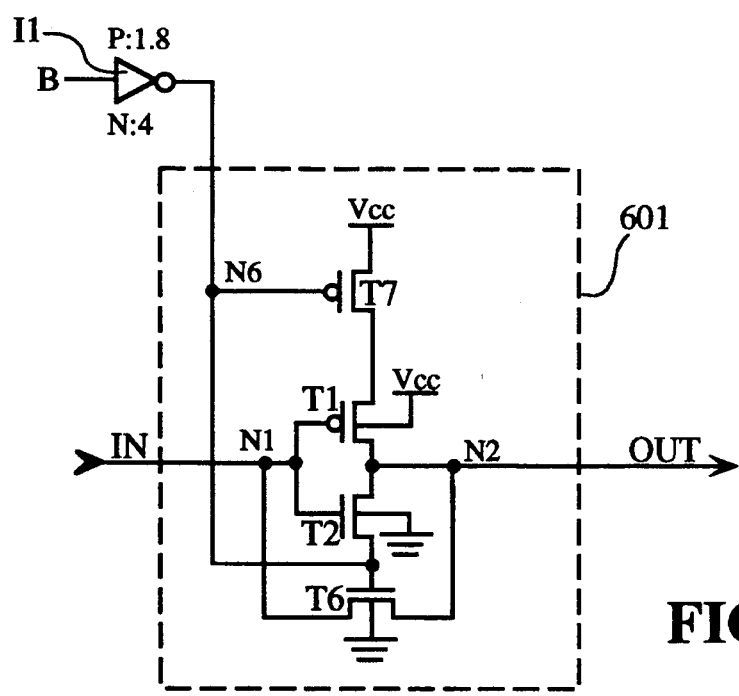

FIG. 6 shows another embodiment in which configuration is controlled by inverter I1 rather than by a memory cell. Input signal B to inverter I1 may be supplied by a memory cell such as M1 or by another control signal. This embodiment has the advantage that the layout of the circuit onto the silicon substrate needs to provide for only one line, the line including node N6. No line including node N5 is provided. As another advantage, there is no possibility that a perturbation in the voltage at node N2 will disturb the contents of a memory cell which drives node N2.

Figure 6A:
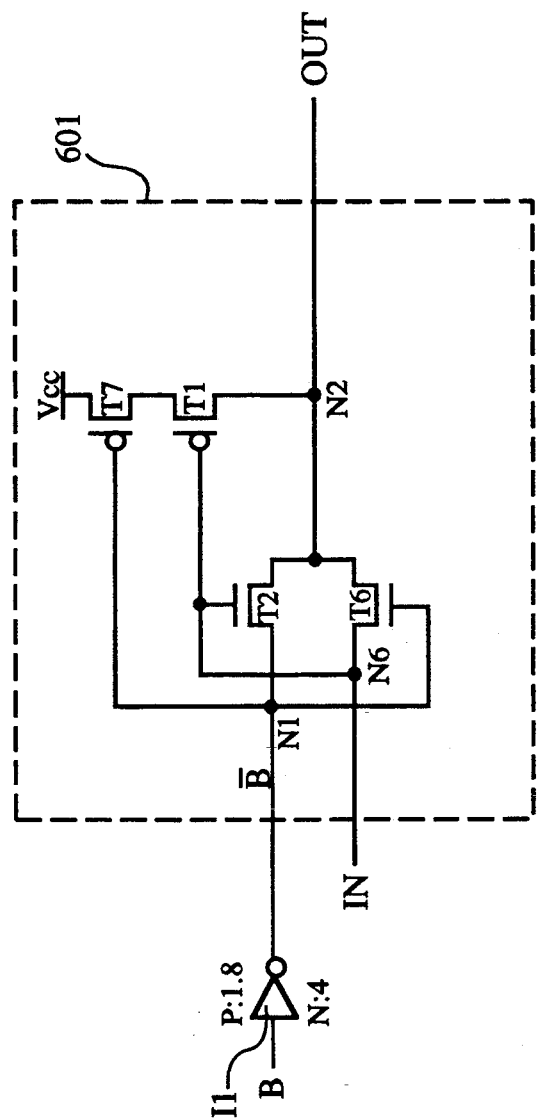
FIG. 6A shows an alternative representation of FIG. 6.

FIG. 6A shows an alternative representation of the circuit of FIG. 6. The same components have the same reference numbers. As most clearly illustrated in FIG. 6A, the circuit provides the XNOR function. Transistors T2 and T6 pull node N2 low when either of signals A and B is low. When A and B are both high, both transistors T2 and T6 are on and the high values pull node N2 high. Only when both A and B are low are transistors T1 and T7 needed. In this case, the low values at A and B turn on transistors T1 and T7, pulling node N2 high to complete the XNOR function. In one embodiment, transistor T1 is a high threshold P-channel transistor, thus being fully off in response to a 3.5 volt signal on node A. Of course the same result can be achieved with a high threshold P-channel transistor T7.

In the inverting mode, the output of inverter I1 is a logical 0, and node N6 turns on P-channel transistor T7, which sources current from the positive voltage source Vcc. In the inverting mode, the output of inverter I1 also serves as virtual ground for the source of transistor T2. Since transistor T7 sources current for driving the output signal, inverter I1 must sink but not source current. Therefore, inverter I1 is manufactured as a CMOS inverter with an N-channel transistor having larger current carrying capacity than its P-channel transistor. In the embodiment shown, the width of the N-channel transistor is at a ratio of 4.0/1.8 to the P-channel transistor.

In the noninverting mode, the output of inverter I1 is a logical 1. In this mode transistor T7 is off, so that no power is supplied to the inverter-like circuit comprising transistors T1 and T2, therefore no power is consumed by these transistors. Transistor T6 is on, and thus applies the input signal on line IN to output line OUT. As discussed in connection with FIG. 4, the logical 1 output voltage will be about 4 volts and the logical 0 output signals will be about 0 volts. Another embodiment not shown but similar to that of FIG. 6 uses both N-channel and P-channel transistors to connect line IN to line OUT, and thus provides the full rail to rail swing discussed in connection with FIG. 5. In yet another embodiment not shown a transistor controlled by a control device such as inverter I1 disconnects a transistor such as T2 from ground. This may be in addition to or instead of a transistor such as T7.

In all embodiments, in the non-inverting mode, there is negligible current drain upon switching because in this mode the circuit does not include a standard CMOS inverter, and there is no open path from power to ground when input voltage is in the range of 2 to 3 volts.

Patent application Ser. No. 07/919,352 incorporated by reference shows in FIG. 16C an implementation of the circuits shown in FIG. 16A and FIG. 16B. In FIG. 16C, the P-channel transistors which receive control signals A and B may be high threshold transistors. Signals A and B may have their logical 1 voltage levels held to about 3.5 to 4 volts by N-channel pass transistors having gates at 5 volts. Thus the high threshold P-channel transistors assure that the NAND gate of FIG. 16C can provide a proper logic 0 output signal and not draw current except during switching.

Also, in this referenced patent application Ser. No. 07/919,352, in FIG. 24B a configuration control unit CCU which include a series of inverters including INV91 and INV92. Before configuration of an FPGA including this circuit, signals PHI and PHIB are both brought high, which sends an asynchronous clear signal through the chain of inverters. As discussed in the related application, signals PHI and PHIB are alternately brought high during configuration to operate as a shift register.

P-channel transistors in inverters such as INV91 and INV92 may be formed as high threshold transistors, for example native P transistors, so that during operation if signal I has a voltage which in turn produces a voltage on the order of 3.5 volts at node N2, inverter INV91 will properly generate a low output signal and will not draw current except on switching.

Figure 7:
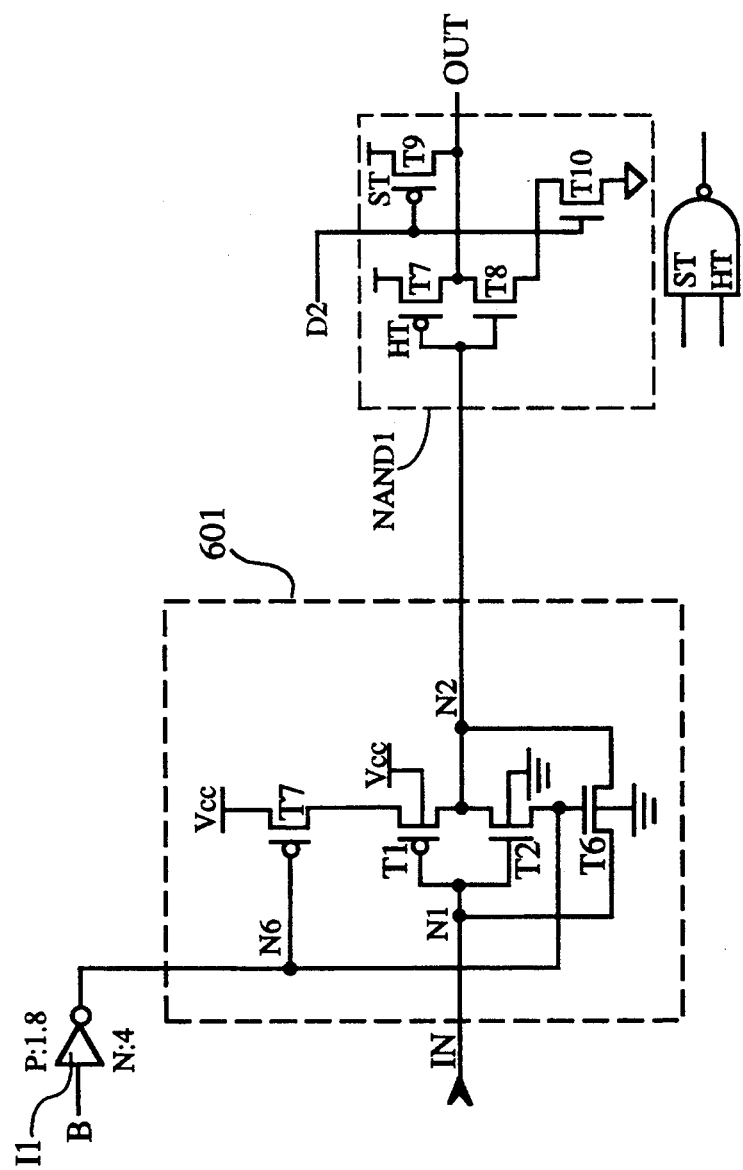
FIG. 7 shows the optional inverter driving a NAND gate which includes a high threshold P-channel inverter.

FIG. 7 represents a circuit which may be driven by the optional inverter of FIG. 6 or FIG. 6A. Relating to FIG. 16C of patent application Ser. No. 07/919,352, transistor T7 of FIG. 7 may be positioned as the transistor receiving signal A in FIG. 16C is positioned. Transistor T9 of FIG. 7 may positioned as the P-channel transistor receiving signal C is positioned in FIG. 16C of the related application. It is not necessary in such an embodiment that transistor T9 be a high threshold P-channel transistor.

In light of the above description, other embodiments will become obvious to those skilled in the art. Such embodiments are intended to fall within the scope of the present invention.

We claim:

1. A low power optional inverter comprising:
    a high threshold P-channel transistor (T1) having a source, a drain, and a gate;
    an N-channel transistor (T2) having a source, a drain, and a gate,
    an input signal line (IN);
    an output signal line (OUT);
    said P-channel transistor and said N-channel transistor having drains commonly connected to said output signal line and gates commonly connected to said input signal line;
    means for in an inverting mode supplying a positive voltage to said source of said P-channel transistor and a negative voltage to said source of said N-channel transistor, and in a non-inverting mode supplying a negative voltage to said source of said P-channel transistor and a positive voltage to said source of said N-channel transistor.

2. A low power optional inverter as in claim 1 in which said means for supplying comprises:
    a memory cell having first and second complementary signals lines carrying signals which are logically complementary to each other;
    said P-channel transistor having a source connected to said first complementary signal line;
    said N-channel transistor having a source connected to said second complementary signal line.

3. A low power optional inverter as in claim 2 further comprising:
    a second N-channel transistor having a gate connected to said second complementary signal line, a first current carrying terminal connected to said input line and a second current carrying terminal connected to said output line.

4. A low power optional inverter as in claim 2 further comprising:
    a second P-channel transistor having a gate connected to said first complementary signal line, a first current carrying terminal connected to said input line and a second current carrying terminal connected to said output line.

5. A low power optional inverter as in claim 2 further comprising:
    a second P-channel transistor having a gate connected to said first complementary signal line, a first current carrying terminal connected to said input line and a second current carrying terminal connected to said output line; and
    a second N-channel transistor having a gate connected to said second complementary signal line, a first current carrying terminal connected to said input line and a second current carrying terminal connected to said output line.

6. A low power optional inverter comprising:
    a high threshold P-channel transistor (T1) having a source, a drain, and a gate;
    an N-channel transistor (T2) having a source, a drain, and a gate,
    an input signal line (IN);
    an output signal line (OUT);
    said P-channel transistor and said N-channel transistor having drains commonly connected to said output signal line and gates commonly connected to said input signal line;

means for in an inverting mode supplying a high voltage to said source of said P-channel transistor and a low voltage to said source of said N-channel transistor, and in a non-inverting mode providing a high impedance to at least one of said source of said P-channel transistor and said source of said N-channel transistor; and means (T6) for in said non-inverting mode connecting said input signal line to said output signal line.

7. A low power optional inverter as in claim 6 in which said means for supplying comprises a second P-channel transistor (T7) having a source connected to receive a positive voltage, a drain connected to said source of said P-channel transistor (T1), and a gate connected to a control voltage source (I1), said control voltage source being further connected to said source of said N-channel transistor.

8. A low power optional inverter as in claim 7 in which said control voltage source comprises a CMOS inverter.

9. A low power optional inverter as in claim 7 in which said control voltage source comprises a memory cell.

10. A low power optional inverter as in claim 6 in which said means for connecting comprises an N-channel transistor.

* * * * *

UNITED STATES PATENT AND TRADEMARK OFFICE
CERTIFICATE OF CORRECTION

PATENT NO. : 5,399,924
DATED : March 21, 1995
INVENTOR(S) : F. Erich Goetting, et. al.

It is certified that error appears in the above-indentified patent and that said Letters Patent is hereby corrected as shown below:

Col. 1, line 32, "Ser. No. 07/919,491FIELD," should read --Ser. No. 07/919,491,--.

Col. 4, line 19, "1.0 below" should read --1.0 volt) below--.

Col. 4, line 26, "to 0" should read --to 0 volts--.

Signed and Sealed this

Twenty-fourth Day of October, 1995

Attest:

BRUCE LEHMAN

Attesting Officer

Commissioner of Patents and Trademarks